United States Patent
Ueda et al.

(10) Patent No.: US 10,866,085 B2
(45) Date of Patent: Dec. 15, 2020

(54) MEASUREMENT APPARATUS, CIRCUIT BOARD, DISPLAY DEVICE, AND MEASUREMENT METHOD

(71) Applicant: Mitsubishi Electric Corporation, Tokyo (JP)

(72) Inventors: Hiroshi Ueda, Kumamoto (JP); Seiji Takaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/292,586

(22) Filed: Mar. 5, 2019

(65) Prior Publication Data
US 2019/0293410 A1  Sep. 26, 2019

(30) Foreign Application Priority Data

Mar. 23, 2018  (JP) .................................. 2018-055917

(51) Int. Cl.
| | | |
|---|---|---|
| *G01B 11/06* | (2006.01) | |
| *H05K 1/02* | (2006.01) | |
| *H05K 1/11* | (2006.01) | |

(52) U.S. Cl.
CPC ......... *G01B 11/0608* (2013.01); *H05K 1/028* (2013.01); *H05K 1/11* (2013.01); *H05K 2201/10121* (2013.01); *H05K 2201/10136* (2013.01); *H05K 2201/10151* (2013.01)

(58) Field of Classification Search
CPC ...... G01B 11/0608; H05K 1/028; H05K 1/11; H05K 2201/10121; H05K 2201/10136; H05K 2201/10151
See application file for complete search history.

(56) References Cited

U.S. PATENT DOCUMENTS

2008/0217771 A1* 9/2008 Tomisaka ................ H01L 24/11
257/737

FOREIGN PATENT DOCUMENTS

| CN | 101261946 A | 9/2008 | |
|---|---|---|---|
| JP | H11-135909 A | 5/1999 | |
| JP | 2007-256209 A | 10/2007 | |
| JP | 2007256209 A * | 10/2007 | ............. G01B 11/02 |

OTHER PUBLICATIONS

An Office Action mailed by China National Intellectual Property Administration dated Oct. 30, 2020, which corresponds to Chinese Patent Application No. 201910202303.4 and is related to U.S. Appl. No. 16/292,586 with English language translation.

* cited by examiner

*Primary Examiner* — Jamil Ahmed
(74) *Attorney, Agent, or Firm* — Studebaker & Brackett PC

(57) ABSTRACT

The object of the present invention is to provide a technic for accurately measuring a connection state between a flexible board and a circuit board. A measurement apparatus includes a flexible board connected to a plurality of electrode terminals in a state of being superimposed on the plurality of electrode terminals provided on a circuit board, and a laser displacement meter configured to measure a height distribution of a surface of a connection portion of the plurality of electrode terminals of the circuit board. The plurality of electrode terminals are linearly arranged at a predetermined pitch, and the laser displacement meter is configured to continuously measure a height position of the surface of the connection portion while scanning from one side to an other side in an arrangement direction of the plurality of linearly arranged electrode terminals.

8 Claims, 4 Drawing Sheets

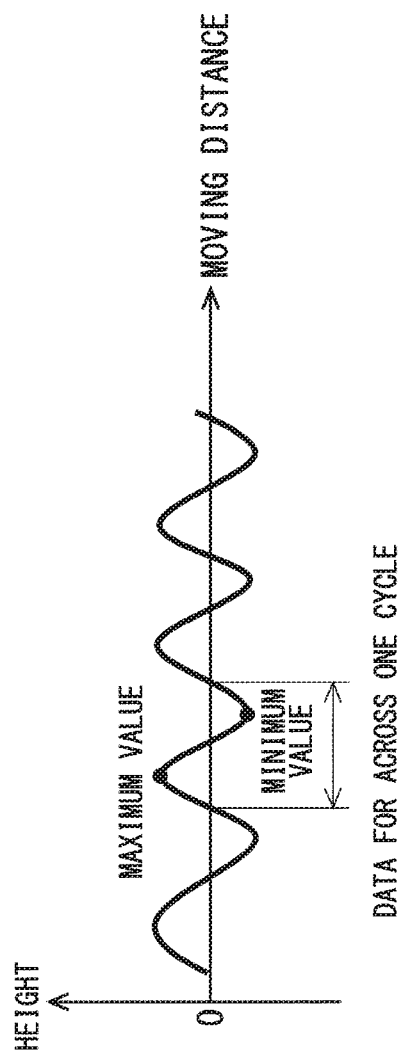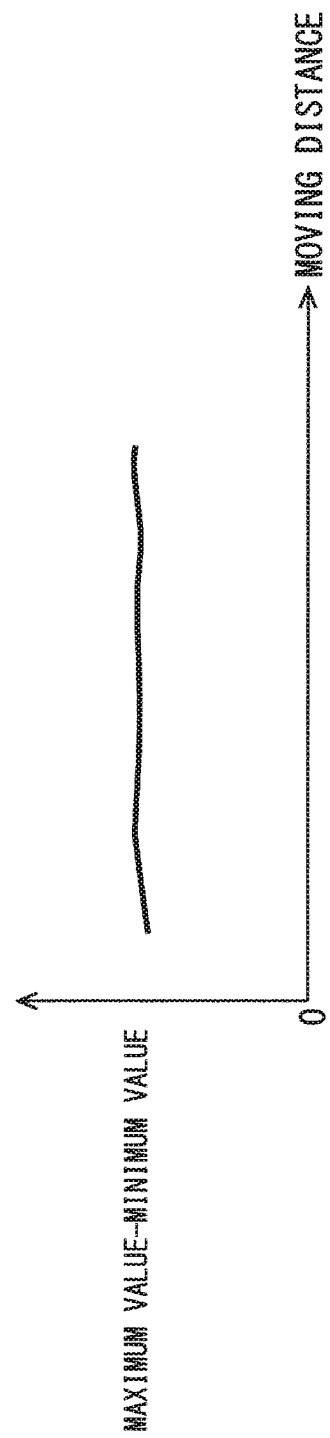

MEASUREMENT APPARATUS, CIRCUIT BOARD, DISPLAY DEVICE, AND MEASUREMENT METHOD

BACKGROUND OF THE INVENTION

Field of the Invention

The present invention relates to a measurement apparatus configured to measure a connection state between a Printed Circuit Board (PCB) and a flexible board (flexible printed circuit (FPC)), a circuit board as a measurement object, a display device provided with a circuit board, and a measurement method.

Description of the Background Art

A flexible board is used as a wiring for connecting between the circuit boards in an electronic device. The flexible board is a wiring board in which a copper foil pattern is formed on a polyimide film. For example, a flexible board used in a liquid crystal display has a flexible board and a terminal portion of the liquid crystal panel or a connection terminal portion for connecting the flexible board and the control board. Between the flexible board and the control board or between the flexible board and a terminal of the liquid crystal panel is connected by a member called an anisotropic conductive film (ACF). Hereinafter, the anisotropic conductive film is referred to as ACF. The ACF is a thermosetting resin film in which conductive particles are dispersed.

The ACF is stuck on the terminal of the control board or the terminal of the liquid crystal panel, and the flexible board is superimposed thereon. Thereafter, by pressing a heated tool from above the flexible board, the conductive particles are sandwiched between the terminal of the control board or the liquid crystal panel and the terminal of the flexible board, electrical conduction is established therebetween. At the same time, the thermosetting resin is cured by heat, so that the terminal of the control board or the liquid crystal panel and the flexible board are physically fixed each other and the conduction state can be maintained.

When the flexible board is pressed with the tool, a silicone rubber sheet or a fluororesin sheet of about 50 μm or more and 300 μm or less is pressed in order to uniformly apply the pressure and heat. In the pressed portion of the flexible board, the portion where the terminal does not exist is shaped in a manner of sinking downward because the film cannot be supported by the terminal.

Meanwhile, the portion where the terminal exists does not sink; therefore, irregularities are formed on the surface of the flexible board after pressing. A connection structure of a flexible board connected by the method is disclosed in, for example, Japanese Patent Application Laid-Open No. 11-135909.

In addition, as a method of determining the adequacy of the connection state of the flexible board, a method of measuring irregularities of the flexible board with a laser displacement meter is disclosed in, for example, Japanese Patent Application Laid-Open No. 2007-256209.

However, the method in Japanese Patent Application Laid-Open No. 2007-256209 is a method of determining from the irregularity amount of the terminals near the both ends of the terminal rows on the flexible board, and cannot measure the state of the entire terminal row. Further, in the method in Japanese Patent Application Laid-Open No. 2007-256209, it is necessary to accurately grasp the position of the terminal. If the measurement result of the position of the terminal is not correct, the measurement greatly affects the measurement of the irregularities, leading to inaccurate determination of the adequacy of the connection state.

SUMMARY

The object of the present invention is to provide a technic for accurately measuring a connection state between a flexible board and a circuit board.

The measurement apparatus according to the present invention includes a flexible board and a laser displacement meter. The flexible board is connected to a plurality of electrode terminals in a state of being superimposed on the plurality of electrode terminals provided on a circuit board. a laser displacement meter is configured to measure a height distribution of a surface of a connection portion of the plurality of electrode terminals of the circuit board. The plurality of electrode terminals are linearly arranged at a predetermined pitch. The laser displacement meter is configured to continuously measure a height position of the surface of the connection portion while scanning from one side to an other side in an arrangement direction of the plurality of linearly arranged electrode terminals.

The laser displacement meter continuously measures the height position of the surface of the connection portion while scanning from one side to the other side in the arrangement direction of the plurality of linearly arranged electrode terminals; therefore, the connection state between the flexible board and the circuit board is accurately measured.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 4A and 4B are graphs for explaining an irregularity amount conversion process.

DESCRIPTION OF THE PREFERRED EMBODIMENTS

Embodiment 1

Figure 1:
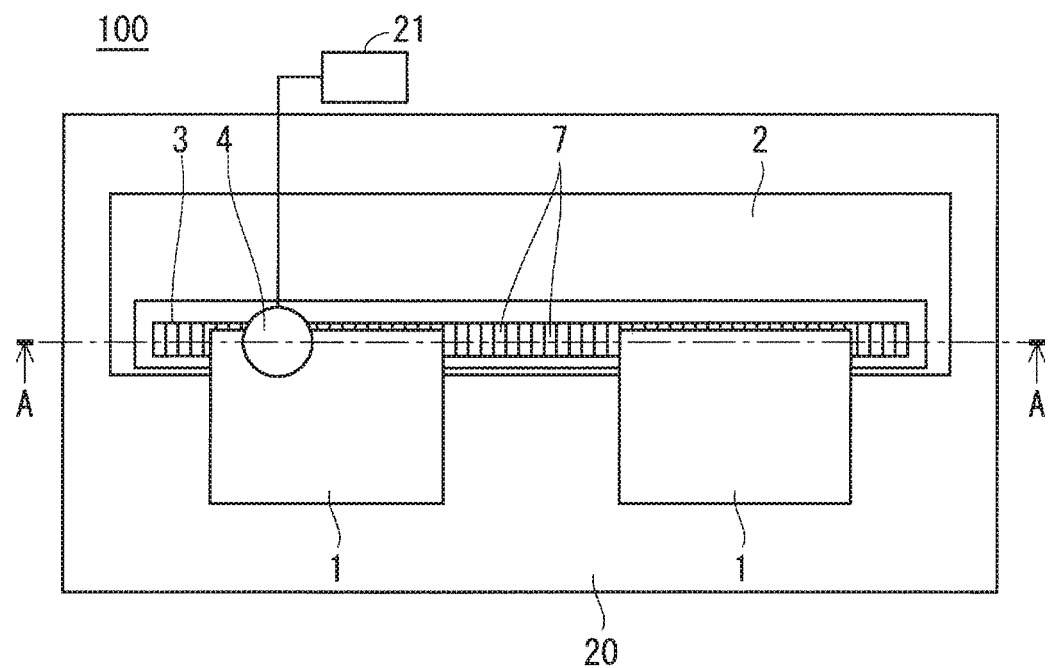
FIG. 1 is a plan view illustrating a state in which the measurement apparatus according to Embodiment 1 measures a connection state between a flexible board and a circuit board.

Embodiment 1 of the present invention will be described below with reference to the drawings. FIG. 1 is a plan view illustrating a state in which the measurement apparatus 100 according to Embodiment 1 measures a connection state between a flexible board 1 and a circuit board 2.

As illustrated in FIG. 1, the measurement apparatus 100 includes a laser displacement meter 4, a stage 20, and a calculation unit 21. On the stage 20, the circuit board 2, which is a measurement object, having a plurality of electrode terminals 7 is placed. The circuit board 2 has a rectangular shape in a plan view, and the plurality of electrode terminals 7 are arranged in the longitudinal direction at one end portion in the lateral direction on the upper surface of the circuit board 2. Further, the plurality of electrode terminals 7 are linearly arranged at a predetermined pitch.

The ACF 3 is arranged around the plurality of electrode terminals 7 including the spaces between the adjacent electrode terminals 7 on the upper surface of the circuit board 2. For example, two flexible boards 1 are connected to the plurality of electrode terminals 7 via the ACF 3 in a state of being superimposed over the plurality of electrode terminals 7. The flexible boards 1 and the circuit board 2 are boards provided in a display device (not shown).

The laser displacement meter 4 continuously measures the height position of the surface of the connection portion between the flexible boards 1 and the plurality of electrode terminals 7 of the circuit board 2 while scanning from one side to the other side in the arrangement direction of the plurality of linearly arranged electrode terminals 7. At this point, it is not limited whether the laser displacement meter 4 or the stage 20 on which the circuit board 2 is placed is actually moved, and either method ensures measurement of the object.

The measurement apparatus 100 further includes a controller (not shown) that controls movement and measurement of the laser displacement meter 4 and movement of the stage 20.

The calculation unit 21 performs processing on measurement data of the laser displacement meter 4. Details of this processing will be described later. The calculation unit 21 may be realized by executing a predetermined software program in an arithmetic processing device such as a Central Processing Unit (CPU), or may be realized by a hardware device.

Figure 2:
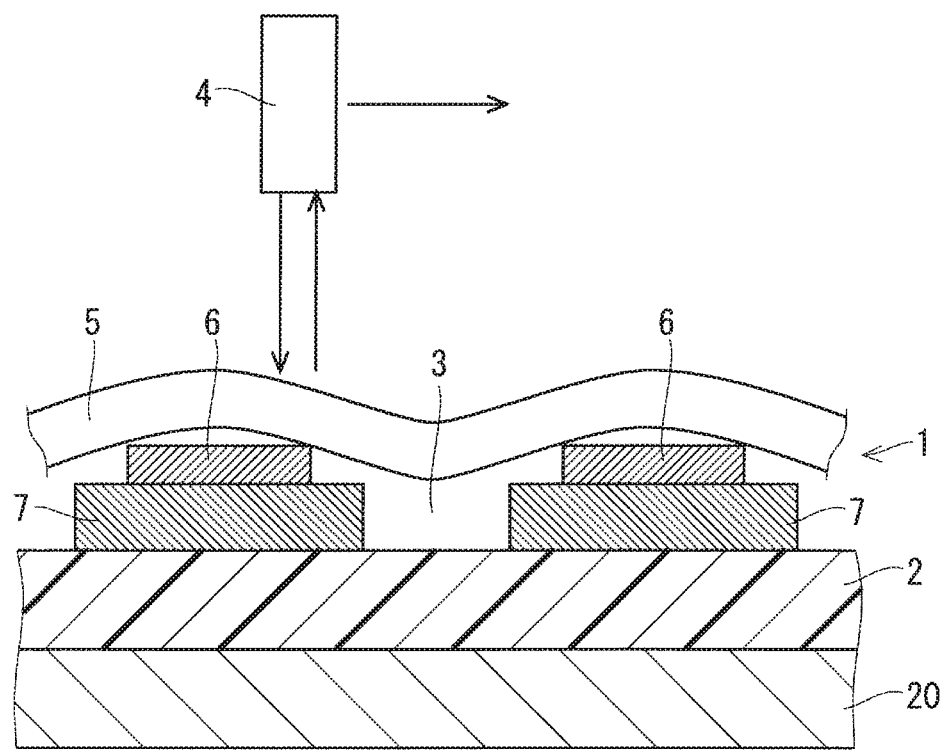
FIG. 2 is a cross-sectional view taken along line A-A in FIG. 1.

Next, a specific measurement method of the connection portion between the flexible board 1 and the plurality of electrode terminals 7 of the circuit board 2 will be described. FIG. 2 is a cross-sectional view taken along the line A-A of FIG. 1, in which only two electrode terminals 7 are shown. As illustrated in FIG. 2, the flexible board 1 has a plurality of flexible board electrodes 6 positioned on the upper surface of the electrode terminals 7 and a flexible board film 5 arranged in contact with the plurality of flexible board electrodes 6 such that the upper surfaces of the plurality of flexible board electrodes 6 are covered thereby. The flexible board film 5 is made of a transparent material such as a polyimide film.

The plurality of flexible board electrodes 6 are the same number as the plurality of electrode terminals 7 and the flexible board 1 and a plurality of electrode terminals 7 of the circuit board 2 are superimposed such that the plurality of flexible board electrodes 6 are positioned on the upper surfaces of the plurality of electrode terminals 7. The flexible board 1 is connected to a plurality of electrode terminals 7 of the circuit board 2 with the flexible board film 5 being pressed from above. Therefore, the flexible board film 5 has a shape in which a portion where the flexible substrate electrode 6 does not exist, that is, between the adjacent flexible board electrodes 6 sinks downward.

When the connection state between the flexible board 1 and the plurality of electrode terminals 7 of the circuit board 2 is inadequate, the flexible board film 5 sinks less or no sinking occurs therein. The laser displacement meter 4 is disposed above the flexible board film 5. The laser displacement meter 4 continuously measures the height position of the surface of the connection portion between the flexible boards 1 and the plurality of electrode terminals 7 of the circuit board 2 while scanning from one side to the other side in the arrangement direction of the plurality of electrode terminals 7.

Figure 3A:
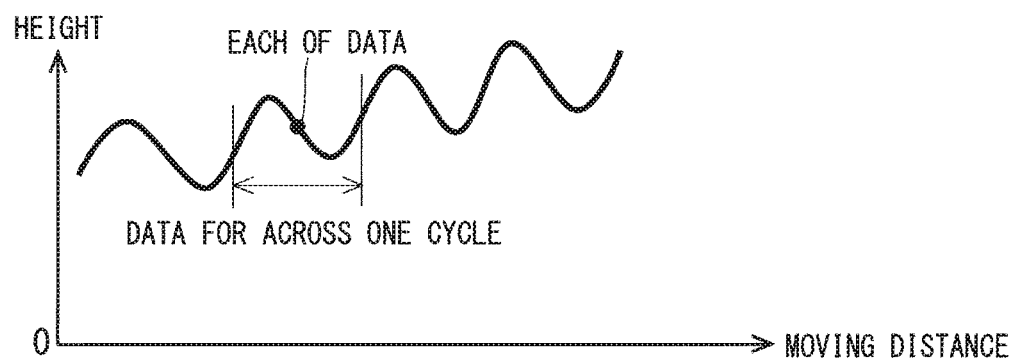
FIGS. 3A and 3B are graphs for explaining preprocessing of measurement data measured with a laser displacement meter.
Figure 3B:
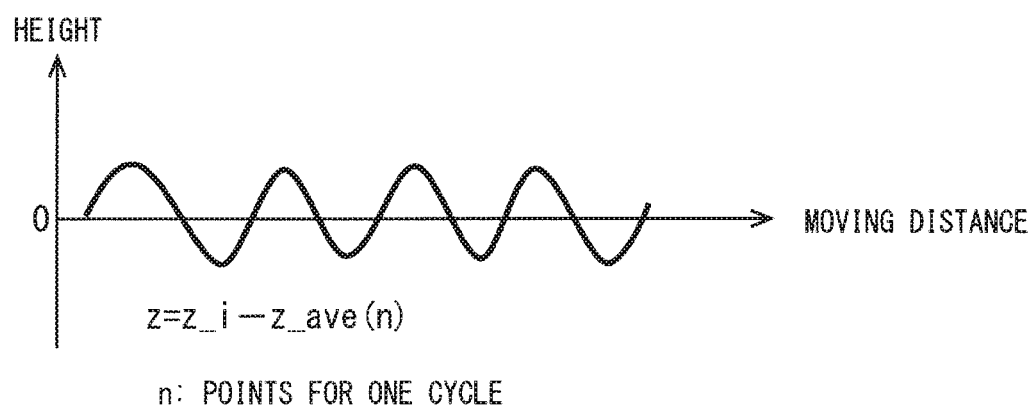

Next, the preprocessing of measurement data measured with the laser displacement meter 4 will be described. FIGS. 3A and 3B are graphs for explaining preprocessing of measurement data measured with the laser displacement meter 4. Specifically, FIG. 3A is a graph illustrating measured data measured by the laser displacement meter 4, and FIG. 3B is a graph illustrating data having had background of the measurement data subtracted.

The flexible board film 5 sinks downward between the adjacent flexible board electrodes 6, therefore, as illustrated in FIG. 3A, the measurement data measured by the laser displacement meter 4 also has a wavy shape in which a portion between the adjacent flexible board electrodes 6 sinks downward. In addition, the flexible board 1 and the circuit board have warpage and inclination, there are also a gradient and a gentle change in the measured data. The calculation unit 21 performs a background subtraction process on the measurement data in order to cancel the warpage and inclination existing on the flexible board 1 and the circuit board.

The contents of the background subtraction process for subtracting the background caused by the warp and the inclination existing on the flexible board 1 and the circuit board will be described. The calculation unit 21 averages the measurement data measured within a range wider than the pitch of the electrode terminals 7 centered on each of the measurement data relating to the height position continuously measured by the laser displacement meter 4 and subtracts the averaged data from each measurement data. More specifically, the calculation unit 21 averages the data for one cycle before and after each of the measurement data centered on each of the measurement data and subtracts the averaged data from each measurement data. As a result, the data illustrated in FIG. 3B is obtained. The data has had the background subtracted and has a shape in which only the shape of irregularities of the surface of the flexible board film 5 remains in the vicinity of the origin (zero point) of the height, as compared with the measurement data by the laser displacement meter 4.

FIGS. 4A and 4B are graphs for explaining an irregularity amount conversion process. Specifically, FIG. 4A is a graph showing data before the irregularity amount conversion process. FIG. 4B is a graph showing data after the irregularity amount conversion process.

Next, the calculation unit 21 performs the irregularity amount conversion process. As illustrated in FIG. 4A, the irregularity amount conversion process is performed on the data after the background subtraction. The calculation unit 21 performs the irregularity amount conversion process in which a value obtained by subtracting the minimum value from the maximum value, within a range wider than the pitch of the electrode terminals 7, centered on each data after the background subtraction is set as the irregularity amount of the flexible board 1. More specifically, the arithmetic unit 21 extracts the maximum value and the minimum value, from the data for across one cycle, centered on each data after the background subtraction, and sets the value obtained by subtracting the minimum value from the maximum value as the irregularity amount, that is, the irregularity amount conversion equivalent. Irregularity amount conversion equivalents are calculated for each of the data after the background subtraction. As a result, the data illustrated in FIG. 4B is obtained.

And the calculation unit 21 determines the adequacy of the connection state between the flexible board 1 and the circuit board 2 based on the irregularity amount conversion equivalents. If there is a portion in which the irregularity amount conversion equivalent lowers a predetermined value, the flexible board film 5 sinks less or no sinking occurs between the adjacent electrode terminals 7. Therefore, the calculation unit 21 determines loose connection of the flexile board 1 and the circuit board 2 due to insufficient pressing of the flexible board film 5 at the time when the flexible board 1 and the circuit 2 are connected, and determines an inadequate connection state between the flexible board 1 and the circuit board 2 due to partial peeling of the flexible board 1.

Meanwhile, when the irregularity amount equivalent exceeds the predetermined value, the calculation unit 21 determines that the state condition between the flexible board 1 and the circuit board 2 is favorable.

The flexible board film 5 is made of a transparent material such as a polyimide film or the like; therefore, a device that detects specular reflection light from the surface of the flexible board film 5 is adopted as the laser displacement meter 4. In addition, the irregularity amount of the flexible board 1 is about 5 μm or more and about 20 μm or less; therefore, a device that measures with an accuracy of at least 1 μm or more is adopted as laser displacement meter 4.

As described above, in the measurement apparatus 100 according to Embodiment 1, the laser displacement meter 4 continuously measures the height position of the surface of the connection portion while scanning from one side to the other side in the arrangement direction of the plurality of linearly arranged electrode terminals 7; therefore, the connection state between the flexible board 1 and the circuit board 2 is accurately measured.

The circuit board 2 is measured by the measurement apparatus 100 with the flexible board 1 connected. The display device includes the circuit board 2 and the flexible board 1. Therefore, the connection state between the flexible board 1 and the circuit board 2 is accurately measured and the quality of the circuit board 1 and the display device is increased. And this enhances durability of the circuit board 2 and the display device.

The measurement apparatus 100 further includes the calculation unit 21 that performs a process in which the warpage and inclination existing on the flexible board 1 and the circuit board 2 are cancelled by averaging the measurement data measured within the range wider than the pitch of the electrode terminals 7 centered on each measurement data relating to the height position continuously measured by the laser displacement meter 4, and subtracting the averaged data from each measurement data centered on. Therefore, the connection state between the flexible board 1 and the circuit board 2 is precisely measured.

The calculation unit 21 sets a value obtained by subtracting the minimum value from the maximum value, within the range wider than the pitch of the electrode terminals 7, centered on each data after the process of cancelling the warpage and inclination of the flexible board 1, as the irregularity amount of the flexible board 1, and determines the adequacy of the connection state of the flexible board 1 and the circuit board 2 based on the irregularity amount.

Therefore, the adequacy of the connection state is determined from the irregularity amount of the obtained data and this eliminates the necessity of grasping exact positions of the plurality of flexible board electrodes 6, thus the precise measurement is readily ensured. Also, the height positions of the surfaces of all the plurality of flexible board electrodes 6 are measured at high speed.

Embodiment 2

Figure 5:
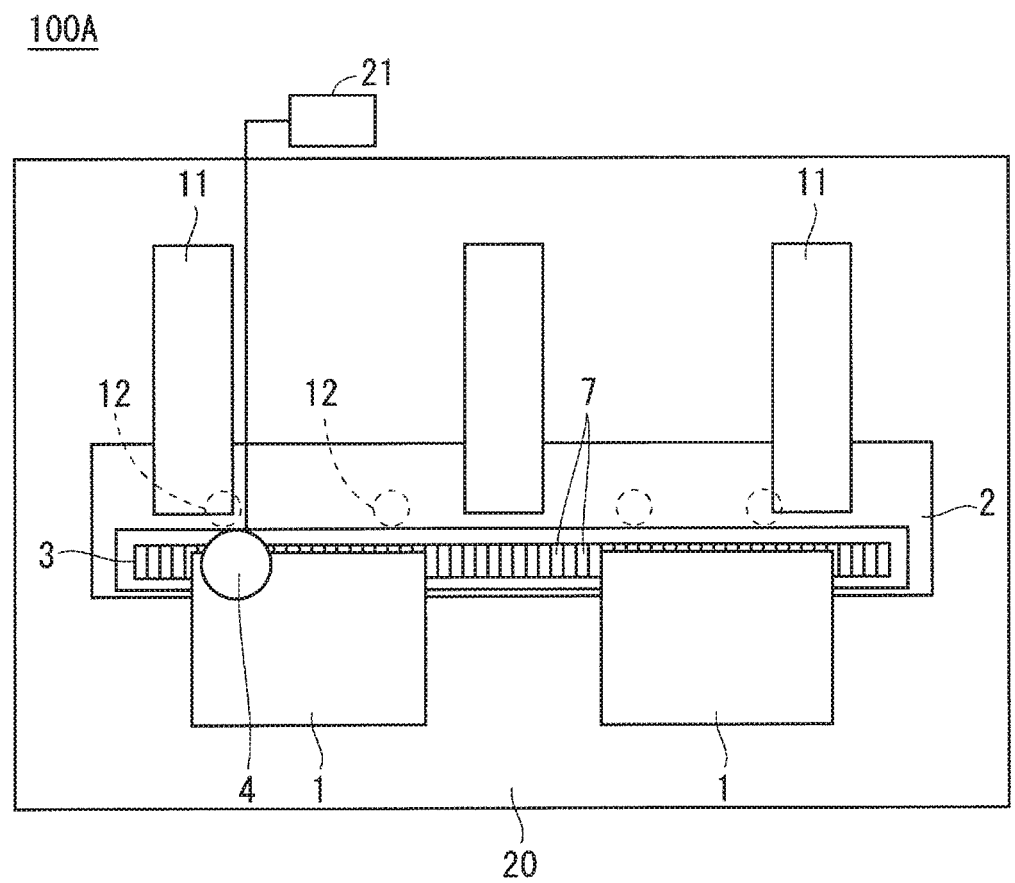
FIG. 5 is a plan view illustrating a state in which the measurement apparatus according to Embodiment 2 measures a connection state between a flexible board and a circuit board.

Next, the measurement apparatus 100A according to Embodiment 2 will be described. FIG. 5 is a plan view illustrating a state in which the measurement apparatus 100 according to Embodiment 2 measures a connection state between a flexible board 1 and a circuit board 2. In Embodiment 2, the same components as those described in the Embodiment 1 are denoted by the same reference numerals, and a description thereof will be omitted.

As illustrated in FIG. 5, in Embodiment 2, the measurement apparatus 100A further includes a plurality of pressing mechanisms 11 for keeping the circuit board 2 horizontal, and the stage 20 has a plurality of suction holes 12 formed on the upper surface thereof for adsorbing the circuit board 2.

For example, the measurement apparatus 100A includes three pressing mechanisms 11, and the three pressing mechanisms 11 are provided at positions in the longitudinal both end portions and in the middle part of the circuit board 2 not overlapping the position measured by the laser displacement meter 4, and press the circuit board 2 from above by control of the controller. The material of the pressing mechanism 11 may be a metal such as aluminum, iron and SUS, or a resin such as acrylic, polystyrene, polycarbonate, vinyl chloride, bakelite and the like.

Further, on the upper surface of the stage 20, for example, four circular suction holes 12 are linearly arranged and a suction fan is provided in the stage 20. By operating the suction fan and applying a negative pressure toward the four suction holes 12, the circuit board 2 is adsorbed to the stage 20 and fixed. Note that the pressing mechanisms 11 and the suction holes 12 may be used in combination, or only one of them may be used.

As described above, the measurement apparatus 100A according to Embodiment 2 further includes the pressing mechanism 11 for pressing the circuit board 2 from above in order to keep the circuit board 2 horizontal, so by keeping the circuit board 2 horizontal, even more accurate measurement of the connection state between the flexible substrate 1 and the circuit board 2 is ensured.

The stage 20 has the plurality of suction holes 12 formed on the upper surface for adsorbing the circuit board 2; therefore, the circuit board 2 is securely fixed on the stage 20. This suppresses the circuit board 2 from budging during measurement; therefore, the connection state between the flexible board 1 and the circuit board 2 is precisely measured.

While the invention has been shown and described in detail, the foregoing description is in all aspects illustrative and not restrictive. It is therefore understood that numerous modifications and variations can be devised without departing from the scope of the invention.

What is claimed is:

1. A measurement apparatus, comprising:
a flexible board connected to a plurality of electrode terminals in a state of being superimposed on the plurality of electrode terminals provided on a circuit board;
a laser displacement meter configured to measure a height distribution of a surface of a connection portion of the plurality of electrode terminals of the circuit board; and a processor, the plurality of electrode terminals being linearly arranged at a predetermined pitch, the laser displacement meter being configured to continuously measure a height position of the surface of the connection portion while scanning from one side to an other side in an arrangement direction of the plurality of linearly arranged electrode terminals, and the processor being configured to perform a process in which warpage and inclination existing on the flexible board and the circuit board are cancelled by averaging the measurement data measured within a range wider than a pitch of the electrode terminals centered on each measurement data relating to the height position continuously measured by the laser displacement meter, and subtracting the averaged data from each measurement data centered on.

2. The measurement apparatus according to claim 1, wherein the processor is configured to set a value obtained by subtracting a minimum value from a maximum value, within the range wider than the pitch of the electrode terminals, centered on each data after the process of cancelling the warpage and inclination of the flexible board, as an irregularity amount of the flexible board, and determine adequacy of a connection state of the flexible board and the circuit board based on the irregularity amount.

3. The measurement apparatus according to claim 1, further comprising pressing the circuit board from above to keep the circuit board horizontal.

4. The measurement apparatus according to claim 1, further comprising a stage on which the circuit board is placed, wherein the stage has a suction hole formed on an upper surface thereof for adsorbing the circuit board.

5. A circuit board being a measurement object of the measurement apparatus according to claim 1, the measurement apparatus being configured to perform measurement with the flexible board connected to the circuit board.

6. A display device, comprising:

the circuit board according to claim 5, and the flexible board.

7. A measurement method for a measurement apparatus including a flexible board connected to a plurality of electrode terminals in a state of being superimposed on the plurality of electrode terminals provided on a circuit board, and a laser displacement meter configured to measure a height distribution of a surface of a connection portion of the plurality of electrode terminals of the circuit board, comprising:

arranging the plurality of electrode terminals linearly at a predetermined pitch;

the laser displacement meter continuously measuring a height position of the surface of the connection portion while scanning from one side to an other side in an arrangement direction of the plurality of linearly arranged electrode terminals; and averaging the measurement data measured within a range wider than a pitch of the electrode terminals centered on each measurement data relating to the height position continuously measured by the laser displacement meter, and subtracting the averaged data from each measurement data centered on to cancel warpage and inclination existing on the flexible board and the circuit board.

8. The measurement apparatus according to claim 1, further including a stage having a plurality of suction holes formed on an upper surface of the stage for adsorbing the circuit board, every suction hole of the plurality of the suction holes being arranged linearly.

* * * * *